(12) United States Patent
Randall et al.

(10) Patent No.: US 7,958,627 B2
(45) Date of Patent: Jun. 14, 2011

(54) METHOD OF ATTACHING AN ELECTRONIC DEVICE TO AN MLCC HAVING A CURVED SURFACE

(75) Inventors: Michael S. Randall, Simpsonville, SC (US); Chris Wayne, Moore, SC (US); John McConnell, Pelzer, SC (US)

(73) Assignee: Kemet Electronics Corporation, Greenville, SC (US)

( * ) Notice: Subject to any disclaimer, the term of this patent is extended or adjusted under 35 U.S.C. 154(b) by 170 days.

(21) Appl. No.: 12/236,126

(22) Filed: Sep. 23, 2008

(65) Prior Publication Data
US 2009/0077800 A1    Mar. 26, 2009

Related U.S. Application Data

(60) Provisional application No. 60/974,594, filed on Sep. 24, 2007.

(51) Int. Cl.
*H05K 3/30* (2006.01)

(52) U.S. Cl. .................. 29/832; 29/830; 29/840; 29/854

(58) Field of Classification Search .............. 29/825, 29/829, 830, 832, 840, 854
See application file for complete search history.

(56) References Cited

U.S. PATENT DOCUMENTS

| | | | | |
|---|---|---|---|---|
| 4,436,953 | A * | 3/1984 | Gottlieb | 174/72 B |
| 6,336,365 | B1 * | 1/2002 | Blackadar et al. | 73/514.34 |
| 6,391,230 | B1 * | 5/2002 | Sarbadhikari | 264/1.38 |
| 6,785,121 | B2 * | 8/2004 | Nakano et al. | 361/321.2 |
| 7,117,588 | B2 * | 10/2006 | Vafi et al. | 29/829 |
| 7,152,314 | B2 * | 12/2006 | Shuto et al. | 29/830 |
| 7,561,438 | B1 * | 7/2009 | Liu | 361/766 |
| 2004/0231885 | A1 * | 11/2004 | Borland et al. | 174/260 |
| 2008/0192452 | A1 | 8/2008 | Randall et al. | |

FOREIGN PATENT DOCUMENTS
WO   2008/100940   2/2008

* cited by examiner

*Primary Examiner* — C. J Arbes
(74) *Attorney, Agent, or Firm* — Joseph T. Guy; Nexsen Pruet, LLC

(57) ABSTRACT

A method of forming an electrical component is provided. The method comprises preparing a subassembly by electrically connecting an integrated circuit to a flexible circuit; and attaching the subassembly to a multilayer ceramic capacitor having a mounting surface with a curvature deviation exceeding 0.008 inches per inch.

14 Claims, 8 Drawing Sheets

METHOD OF ATTACHING AN ELECTRONIC DEVICE TO AN MLCC HAVING A CURVED SURFACE

CROSS-REFERENCE TO RELATED APPLICATIONS

This application claims priority to U.S. Provisional Patent Appl. No. 60/974,594 filed Sep. 24, 2007 which is incorporated herein by reference.

BACKGROUND OF THE INVENTION

The present invention is directed to a method of attaching a semiconductor integrated circuit active device to a multilayer ceramic capacitor (MLCC) having a non parallel and a non-uniform surface as compared to the surface of the Integrated Circuit (I/C), and at the same time, creating additional opportunities for increasing functionality of the MLCC assembly.

The proliferation of smaller, more complex, electronic devices is a never ending trend of the electronics industry. Market dynamics have forced circuit designers to achieve more functionality in less space. This has led to a myriad of problems at every level of circuit design starting with the component design, through component attachment techniques, circuit board design, and the design of the device packaging. Design engineers have been forced to develop innovative solutions to increase module functionality without increasing module footprints.

Initially I/C's were connected to a lead frame via a wire bonding process that uses gold wires as the connecting link between the I/C and the lead frame. The lead frame and I/C were then over-molded with epoxy to form a rigid body protecting the I/C from the outside environments. The I/C package was then suitable for assembly onto circuit boards containing additional circuitry and other components. The size of components was not a significant issue in the infancy of the electronics industry. But as size, portability, and increased functionality of electronics became design driving issues, entire assemblies and the components used in them also had to decrease in size.

As the micro electronics industry continues to evolve, more emphasis is being placed on increased functionality fitted into smaller spaces. This trend increases the pressure on packaging, thus forcing the development of new I/C interconnects and packaging technologies that provide continually decreasing foot prints. The ultimate I/C packaging goal is for the package footprint to be no larger than the I/C itself. Towards this goal of miniaturization the I/C has migrated out of the large epoxy over-molded packages and is now frequently mounted directly onto the surface of the circuit board.

The I/C interconnect methods typically include a wire bonding process, as well as other interconnect technologies such as TAB bonding and flip chip bonding. Flip chip bonding technology utilizes small conductive "Bumps" having controlled heights, located on the interconnect pads of the I/C. The chip is flipped face down onto pre-applied solder paste and then soldered directly into position on an electronic circuit board thereby creating an interconnected I/C whose footprint is no larger than the I/C itself. The vertical dimension of the bumps determines the amount of stand-off between the face of the I/C and the substrate to which it is mounted. These bumps can be of different metallurgies generally comprising various solder alloys or gold and having high enough melting points so as not to deform during subsequent attachment or reflow processes. These I/C interconnect technologies have provided design engineers with multiple design options to select from and to pick the best interconnect technology that best satisfies design and performance criteria.

Typically, electronic substrates are relatively flat, <0.010" deviation per inch of linear length depending on the substrate material. Due to the design of MLCC's, a doming effect can exist on the surface of the MLCC as will be described further herein. This doming effect can be 0.008" of deviation per inch or even greater over the surface of the MLCC. The doming problem is a particular issue as the size of the MLCC starts to approach the size of the I/C that is to be mounted to the MLCC. Typically wire bonding would be the interconnect technology of choice to interconnect the I/C with the active circuit. However, as the MLCC approaches the size of the I/C, the wire bonds to the MLCC have to be placed near the edge of the MLCC where the maximum amount of rounding occurs. This creates a poor bond and results in lower yields or field reliability issues.

A second issue associated with attaching I/C's directly to the surface of the MLCC is due to the curvature associated with the surface of the MLCC. Since the I/C's are flat by nature, attaching an I/C to a domed surface will leave gaps at the edges of the I/C. It is desirable to create a bond line of uniform thickness between the I/C and the substrate surface to minimize potential Coefficient Thermal Expansion (CTE) issues and also to provide a solid support under the bond pads, located on the face of the I/C, for optimized bonding performance.

Flip Chip bonding of the electronic I/C(s) to the substrate is a potential solution to these two problems. Flip chip attachment enables the footprint area of the electronic chip to be equal to or even larger than the substrate, thereby improving the volumetric functionality of the resulting electronic device.

Flip chip refers to the attachment of a patterned set of conductive three dimensional structures such as ball, stud or other three dimensional structure, fabricated on the bond pads located on the active face of the I/C. These "bumps", as they are typically referred to, are created during the wafer processing. After the chips have been tested and singulated from the wafer, they are ready for attachment to the circuitry of the circuit board. The electronic chip is then flipped to the "face and bumps down orientation"; the bumps are aligned with corresponding bond pads on the circuit board and then placed into position on the circuit board.

Typically, when a substrate exhibits high amounts of surface curvature, remediation steps must be taken to reduce the surface curvature of the substrate. Such steps may include, but are not limited to, planarization using a surface grinder and polisher, flat firing where the substrate is kept flat using weights or pressure during firing, or other methods used to flatten surfaces. These methods, while at least somewhat effective, are relatively cost prohibitive and are suitable only for relatively large substrates with a size larger than about 0.25"×0.25".

There has been a desire for a method for interconnecting one or more substrates with relatively high levels of surface curvature, such as >0.008" of deviation per linear inch of dimension, to one or more electronic chips, which may or may not have relatively high surface curvature in a manner that is simple and cost effective.

SUMMARY OF THE INVENTION

It is an object of the invention to provide a method of attaching an I/C to a MLCC wherein the substrate and/or chip have surfaces which deviate from planarity.

It is another object of the invention to enable economical, robust attachment of an electronic I/C to a curved or domed substrate having surface curvature in excess of 0.008" per linear inch.

A particular advantage of the present invention is the ability to use MLCC's which have a planarity outside the range of manufacturing tolerance without requiring the MLCC to be reworked or treated to reduce the deviations from planarity.

A particular advantage is that the method can be done without having to deposit solder or other interconnect metallurgy to the substrate.

The present invention allows a 3-Dimensional conductive structure to accommodate surface curvature of a substrate.

These and other advantages, as will be realized, are provided in a method of forming an electrical component. The method comprises preparing a subassembly by electrically connecting an integrated circuit to a flexible circuit. The subassembly is then attached to a multilayer ceramic capacitor having a mounting surface with a curvature deviation exceeding 0.008 inches of deviation per linear inch.

Yet another advantage is provided in a method of forming an electrical connection. The method includes providing a substrate wherein the substrate has a mounting surface with a curvature deviation exceeding 0.008 inches per inch. Providing an electronic component. Forming a conductive column on the electronic component wherein the conductive column has a height which is at least as large as a sum of the curvature deviation, a stand-off distance between the substrate, the electronic component and a compression distance. The substrate is attached to the conductive column. The substrate is bonded to the electric chip through said conductive column.

Yet another embodiment is provided in a method for forming an electronic component. The method includes the steps of:
providing a flexible circuit;
providing an integrated circuit;
providing a multilayer ceramic capacitor wherein the multilayer ceramic capacitor comprises a curvature of at least 0.008 inches per linear inch;
placing the flexible circuit in a locating fixture;
applying solder paste to each pad of the flexible substrate;
picking the integrated circuit from a shipping container;
aligning the integrated circuit with the solder paste;
reflowing the solder paste to form an electrical connection between each pad and the integrated circuit;
placing the multilayer ceramic capacitor in a second locating fixture;
applying second solder paste to the multilayer ceramic capacitor;
orienting the flexible substrate, with the integrated circuit mounted thereon, with the multilayer ceramic capacitor; and
reflowing the second solder paste to form an electrical connection between the flexible substrate and the multilayer ceramic capacitor.

DETAILED DESCRIPTION

Figure 1:
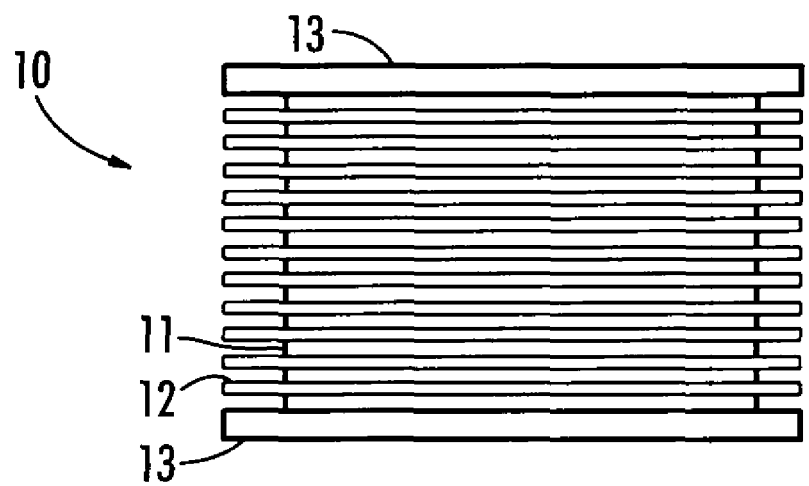
FIG. 1 illustrates a multilayer substrate in cross-sectional side view prior to void removal/sintering.

Provided herein is an improved method for attaching electronic devices to a substrate having a curved surface. More particularly, the present invention provides a method for attaching electronic devices to a substrate with a curvature of more than 0.008 inches per linear inch.

More particularly, this invention provides a unique solution that utilizes the surface of an MLCC to attach an active I/C onto the surface of the MLCC while integrating the I/C into the active circuitry of the module.

In one embodiment this invention provides a solution to a problem that exist at the component level by providing a method of mounting an electronic chip to a MLCC having a potential surface curvature in excess of 0.008 inch/linear inch to achieve a mechanically sound and electrically robust bond in a cost effective manner by combining the advantages of Flip Chip technologies with the flexibility of small flex circuits called Re-Distribution Layers, (RDL's).

The invention will be described with respect to the figures forming an integral part of the instant application. In the figures similar elements will be numbered accordingly.

The 3-dimensional conductive structures may comprise multiple metallurgies such as solder at the substrate connection interface with Au at the electronic chip interface or the like. The 3-dimensional structures may be accomplished via solder reflow, thermosonic bonding, wire bonding, bump bonding, plate-up, pin attach, ball attach, adhesive attach, conductive epoxy cure or the like or any combination there of or any attach method that is suitable.

The invention preferably involves the use of either stud bumping technology or ball attach technology or plating technology or the like, or a combination thereof, to form three dimensional conductive structures on a multi-up electronic chip substrate, also known as a processed wafer, in the pattern desired.

Attachment and interconnect is preferably accomplished via one or more of various methods such as solder reflow, conductive epoxy, or thermo-sonic bonding or other bonding techniques that may apply. The elevation of the conductive three dimensional structure must exceed the extent of the surface curvature of the substrate to which the electronic chip is attached, after attachment is completed, including any collapse of the three dimensional conductive structures during the attachment process. Using flip chip technology, the size of the 3 dimensional conductive structures, or ball size, is typically determined by spatial pitch requirements such that the maximum number of input outputs (I/Os) per unit area may be achieved. Otherwise, the mechanical and electrical aspects of the flip chip interconnect may be compromised. Also, ball size or column height may be selected in order to provide strain relief in situations where high levels of thermal cycling stress are present which typically occurs with large devices with large differences in thermal expansion coefficients between the substrate and the electronic chip. With most situations where flip chip or BGA technology or the like is used, the surfaces of both of the planes involved in the attachment process (i.e., the electronic chip "bottom" and the substrate "top") must be relatively coplanar. For reference, typical specifications for co-planarity are on the order of 0.004" deviation per linear inch to a typical maximum of 0.008" deviation per linear inch using JEDEC standard JESD22-108A.

The Z-axis dimension of the 3 dimensional conductive structure, as measured perpendicular to the electronic chip, is selected such that it exceeds the maximum Z-axis dimension of the combined curvature of the substrate and electronic chip by at least 2.5% including any collapse of the three dimensional conductive structure during the attachment process. The wafer is then singulated into individual electronic chips, each with the desired pattern of 3 dimensional conductive structures of the appropriate Z-axis dimension to achieve appropriate stand-off of the substrate and the electronic chip(s).

Particularly suitable bonding techniques include dipping the three dimensional structure into solder paste or the like after the 3 dimensional structure has been established on the electronic chip and prior to placement of the chip on the substrate.

Appropriate electrical and mechanical interconnects are then accomplished either by reflow processing, by thermosonic bonding, curing the structure in place or the like or a combination thereof as all of these are current practices in the surface mount electronics industry. Note that the use of reflow attachment techniques may require the use of a higher temperature solder for the chip to substrate attachment as compared to the solder used for the substrate to circuit board attachment.

Reflow processing is typically employed when one or more of the metals used in the 3 dimensional conductive standoff is a solder material. High temperature solders may be required for the primary reflow in processes requiring multiple reflows.

Thermosonic bonding is typically employed in the case when one or more non-soldering metallurgies is being used as a part of the conducting 3 dimensional structure.

In some cases depending on the size of the I/C and application, none conductive underfills may be used to fill the void between the face of the chip and the surface of the substrate to enhance the structural integrity of the interconnect structures.

For the purposes of the present disclosure, high surface curvature means surface curvature of more than 0.008" deviation per linear inch dimension of substrate or electronic chip or the net of the two.

The present invention provides a three dimensional conductive structure attached to an electronic chip used with the express intent of enabling appropriate stand-off from a curved substrate in order to enable high speed, low cost interconnection of electronic chip and curved substrate having curvature in excess of 0.008" deviation per linear inch. Note that the standoff provided by the three dimensional conductive structure must be calculated to exceed the net surface curvature of the two common attach surfaces plus any collapse of the three dimensional conductive structures resulting from the attachment process. The amount of standoff preferably exceeds the upper limit of an appropriate statistical distribution of net surface curvature by at least 2.5%.

The present invention allows one or more dissimilar metals in a 3 dimensional conductive structure used to provide appropriate stand-off between and electronic chip and a curved substrate. The present invention enables low cost, robust interconnection of the electronic chip and the curved substrate. The dissimilar metals may be achieved via stud bumping, plating, dipping or other practice as is common in the industry.

The present invention enables the use of larger electronic chip relative to substrate foot print area as compared to traditional wire bonding.

The present invention allows stacking of one or more electronic chips on a single curved substrate structure either in a single layer or in multiple layers. Stacking of multiple chip layers may be accomplished using Through Silicon Via (TSV) technology or the like The present invention enables reflow attachment of an electronic chip to a curved substrate without the need for depositing solder paste on the curved substrate The present invention enables the attachment of one or more electronic chips to the substrate after the substrate has been attached to the circuit board. This could reduce or eliminate fixturing and alignment costs as the substrate would first be placed using conventional pick and place technology, then the electronic chip would be placed subsequent to substrate attachment.

The present invention allows a 3 Dimensional structure made of dissimilar materials to achieve the attachment of an electronic chip to a curved substrate without the need of solder paste deposition.

The present invention allows the use of a post substrate mount electronic chip attachment to a curved substrate in order to provide a high through put, mechanically and electrically robust interconnect to a curved substrate after mounting to a circuit board. The process eliminates fixturing and alignment needed for traditional electronic chip attach to substrate pre-population on electronic circuit board.

In implementing the present invention the Z-axis height of a 3 dimensional conductive structure is selected such that it is greater than at least 102.5% of the upper maximum of the net curvature or distance required between adjacent attached devices, whether it be electronic chips, substrates or any combination thereof, after all attach and collapse events associated with the interconnection procedure are accounted for.

A multilayer substrate is illustrated in cross-sectional end view, prior to void removal, in FIG. 1. In FIG. 1, the multilayer substrate, 10, comprises various primary layers, 11, such as conductive layers, separated by secondary layers, 12, such as dielectric layers. The upper and lower layers, 13, are relatively flat with minimal deviation from planarity.

Figure 2:
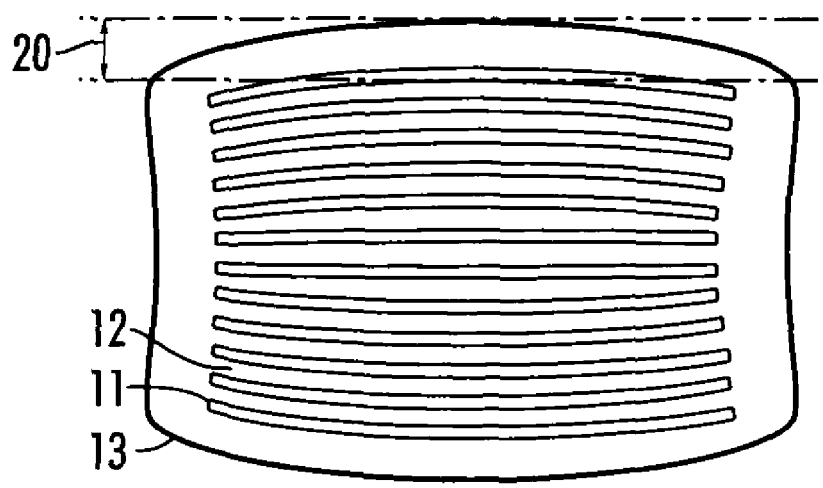
FIG. 2 illustrates the multilayer substrate of FIG. 1 after void removal/sintering.

The multilayer substrate of FIG. 1 is illustrated in FIG. 2 after void removal. As illustrated in FIG. 2, the compression causes the center of the substrate to be thicker than the sides thereby leading to a bowed, or curved, structure. The curvature deviation, 20, is the difference between the highest point on the surface to the lowest point on the surface. Alternatively, the lowest point may be the point of electrical contact.

Figure 3:
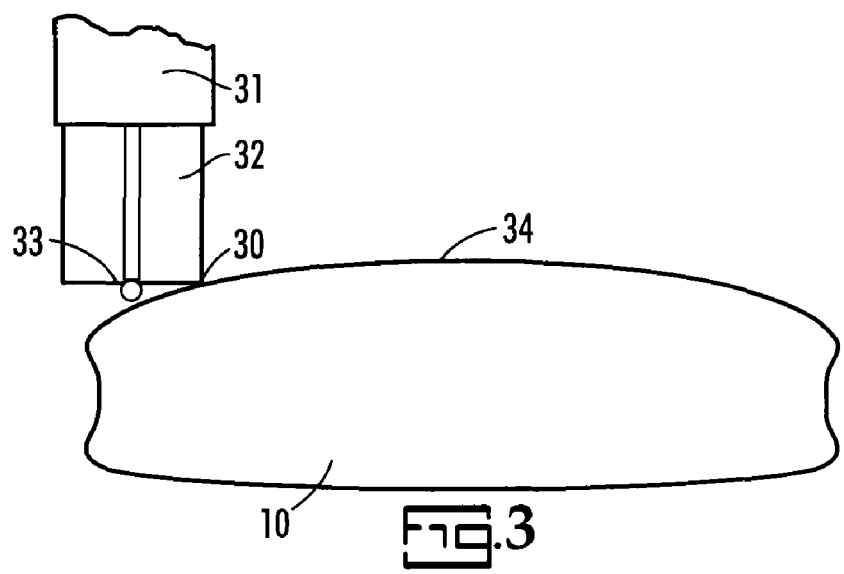
FIGS. 3 and 4 illustrate curvature and the problems associated therewith.
Figure 4:
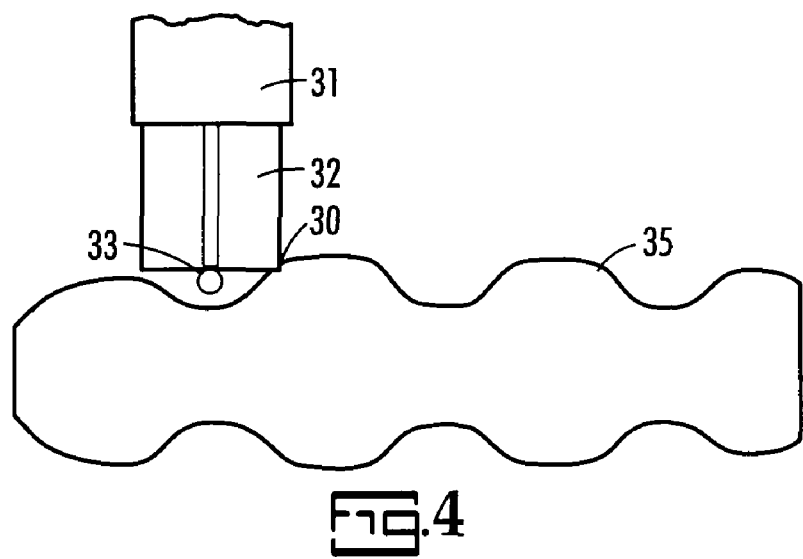

The problem associated with curvature as related to wire bonding as illustrated in FIGS. 3 and 4 and described relative thereto. In FIG. 3, the wire bonder, 31, comprises a capillary tip, 32, which when contacting the curved surface to make the second bond cannot make sufficient contact with the curved surface to generate sufficient pressure to make a reliable bond of the wire to the substrate FIG. 4 illustrates an undulating surface, 35, wherein the capillary may be unable to come within the necessary contact distance to apply the necessary bond forces needed to ensure a proper bond. This may result in a broken capillary, faulty bonds or both.

Figure 5:
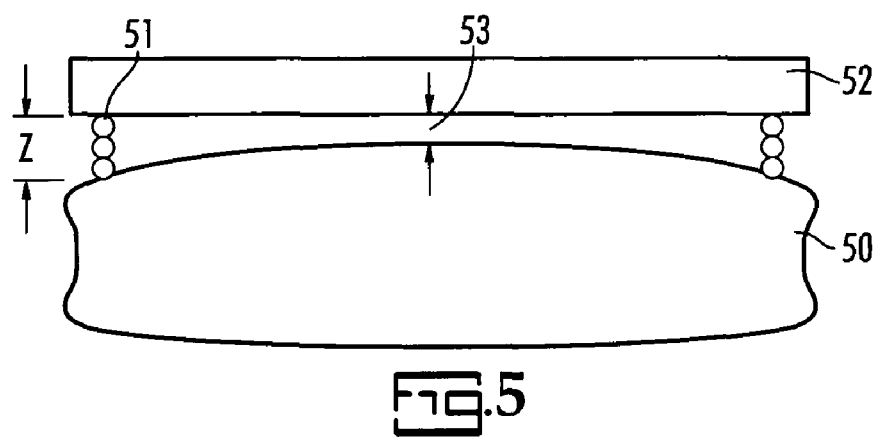
FIG. 5 illustrates an embodiment of the present invention.

An embodiment of the invention is illustrated in FIG. 5. In FIG. 5, a domed substrate, 50, is illustrated. For the purposes of discussion the chip is relatively flat in the illustration, however, curvature on the chip could be accommodated as well. A columnar bond, 51, is illustrated wherein the columnar bond has a sufficient height, Z, as measured from the chip, 52, to accommodate the curvature of the substrate plus the compression of the bond, as will be described more fully herein, such that the substrate has a sufficient stand-off distance, 53, to accommodate standard manufacturing variances.

Figure 6:
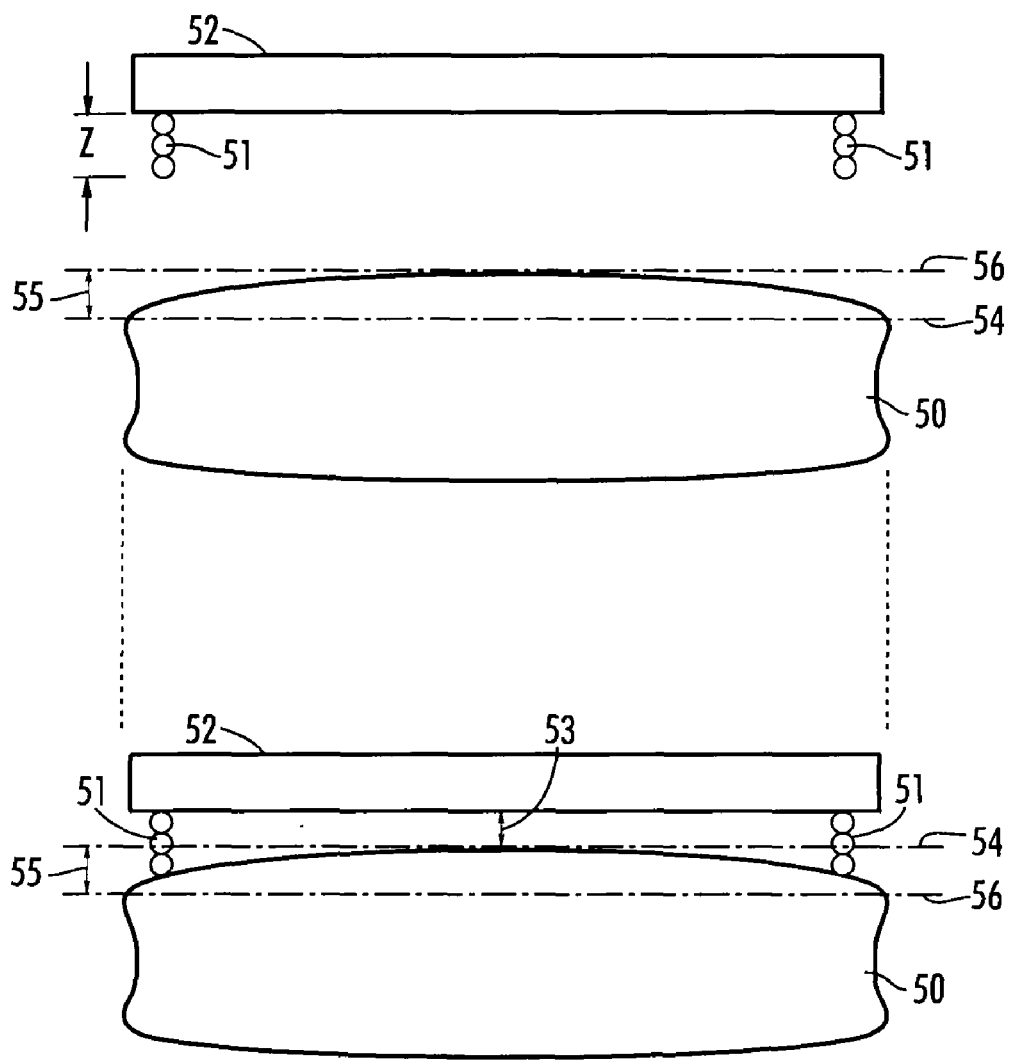
FIG. 6 illustrates another embodiment of the present invention.

The process for determining the standoff height is described with reference to FIG. 6. In FIG. 6, a substrate, 50, is shown prior to mounting to a chip, 52. The columnar bond, 51, shown as a series of stud bumps, has a height, Z. As described above the substrate, 50, has a curvature deviation, 55, defined as the largest protruding deviation from the plane containing the lowest point to the parallel plane containing the highest point. If there is any deviation from planarity in the chip the curvature deviation is calculated in an identical fashion and added to the curvature deviation of the substrate for subsequent determinations. As the substrate and chip are brought into mounted arrangement the solder is compressed. In addition, it is desirable to have a separation, 53, between the substrate and chip. As a result the straight line distance between the center of the solder on the substrate and the center of the solder on the chip is the sum of the separation and curvature deviation. The height of the solder, Z, prior to compression is therefore defined as the sum of the separation, deviation and compression.

In practice the separation height of the solder is increased by 25% over the sum of the separation, curvature and deviation to allow for manufacturing variations in the curvature deviation and compression.

Figure 7:
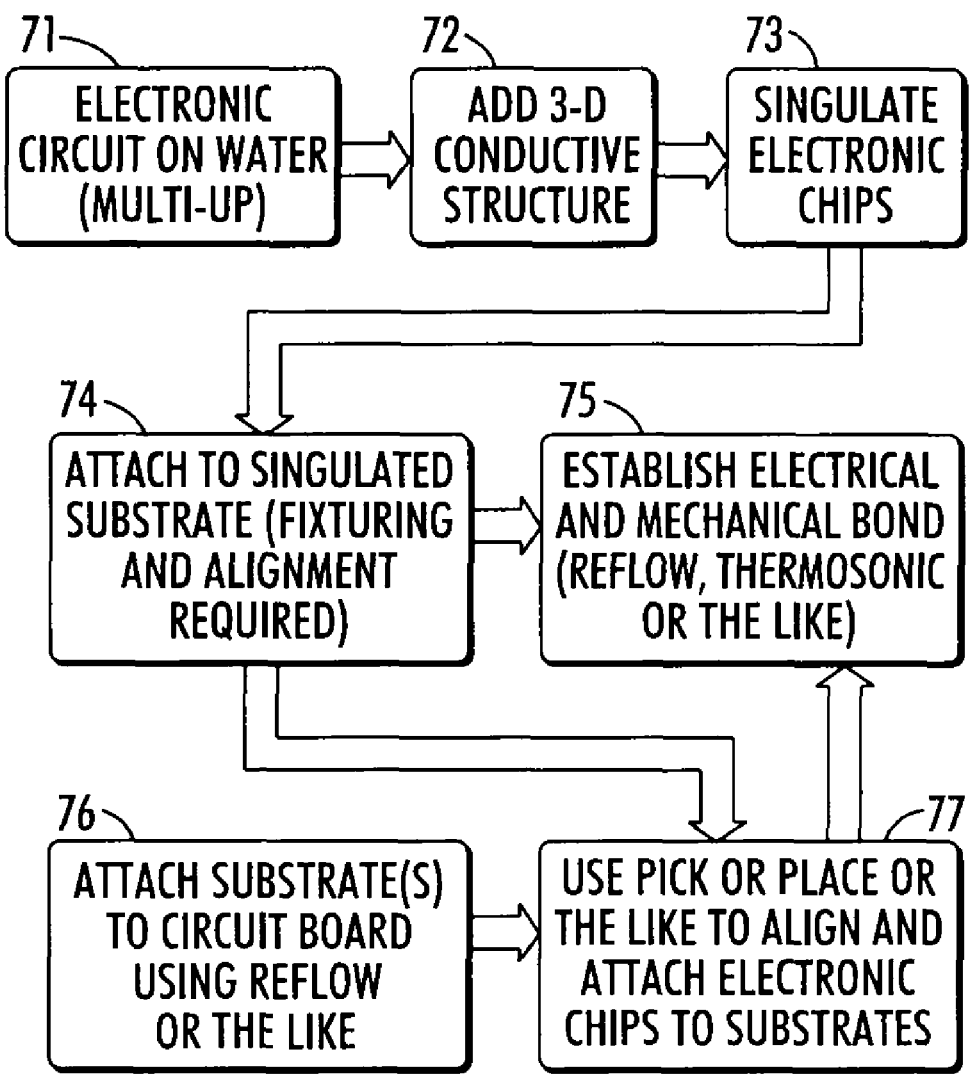
FIG. 7 illustrates, in flow-chart representation, and embodiment of the present invention.

A preferred method of the present invention is illustrated in a flow chart in FIG. 7 and will be described with reference thereto. In FIG. 7, an electronic circuit is formed on a wafer, 71. This process, also referred to as a multi-up, is well known in the art of circuit design. A conductive column is applied at 72 as described elsewhere herein. As would be understood from the discussion herein the height of the conductive column is preferably at least 2.5% higher that of the sum of the maximum deviation, column collapse and separation distance. It is then preferable to singulate, 73, to form a singulated electronic chip. Singulation techniques are known in the art and not limited herein. The singulated electronic chip is then attached to a singulated substrate, 74. This typically requires fixturing and alignment as would be realized. Alternatively, the electronic chip can be aligned and attached to the substrate by Pick and Place techniques as known in the art. A mechanical and electrical bond is formed, 75, by reflow, thermosonic soldering or the like. In an alternative embodiment the substrate can be attached to a circuit board, 76, using reflow or the like followed by pick and place alignment and attachment of the electronic chip to the substrate, 77. An electrical and mechanical bond is then formed at 75.

The conductive column may be cylindrical. In one embodiment the conductive column is formed as a multiplicity of conductive balls in a stacked pattern to achieve the desired dimensions.

Figure 8:
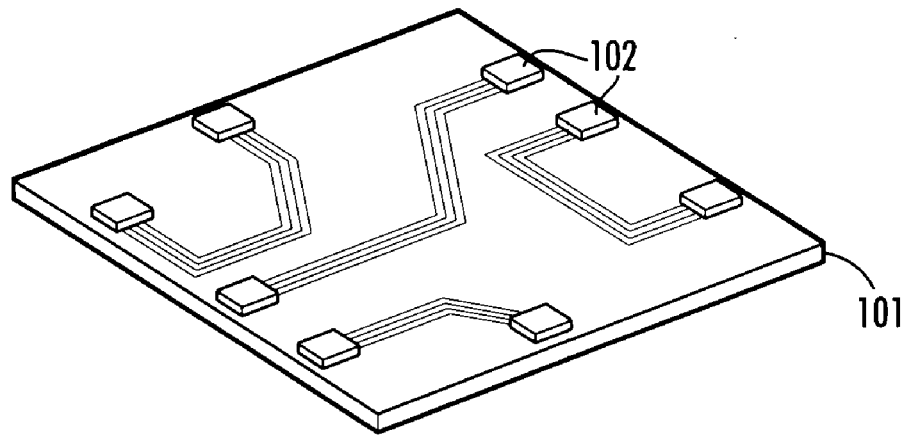
FIG. 8 illustrates a typical Integrated Circuit (I/C).

FIG. 8 illustrates a typical integrated circuit, 101, with input/output pads or circuit connections, 102.

Figure 9:
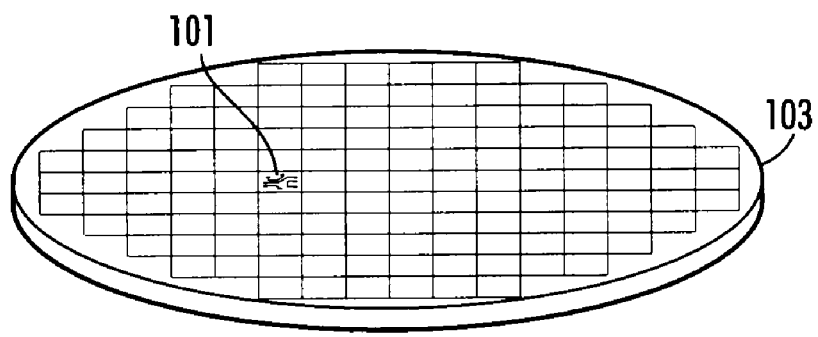
FIG. 9 illustrates an I/C in the form of a wafer.

FIG. 9 illustrates the I/C in the wafer form, 103, which can range in size from 2" diameter wafers to 12 inch diameter wafers.

Figure 10:
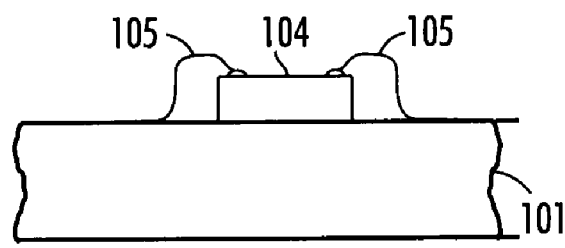
FIG. 10 illustrates a substrate with an I/C mounted thereon.

FIG. 10 illustrates a substrate in side view having an I/C, 104, mounted in position and electrically connected to the circuit traces of the I/C, 101, by small wires, 105, typically attached by a thermo-sonic wire bonding process but not limited thereto.

Figure 11:
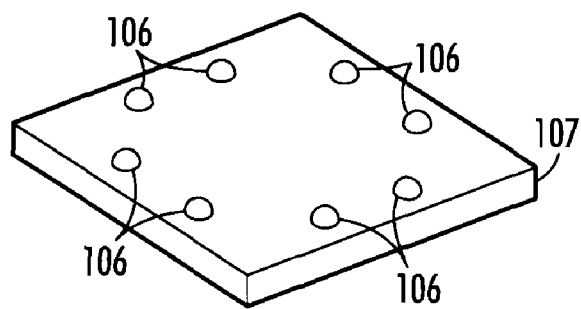
FIG. 11 illustrates an I/C with solder bumps attached to the I/C's Input/Output pads.

FIG. 11 Illustrates an I/C, 107, with bumps, generally solder bumps, 106, attached to the I/C's Input/Output pads. These bumps replace the wires and the wire bonding process shown in FIG. 9.

Figure 12:
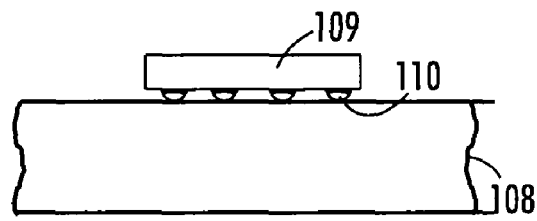
FIG. 12 illustrates a substrate flipped and attached and electrically interconnected to circuit traces.

FIG. 12 Illustrates a substrate, 108, having the Flip Chip I/C, 109, flipped and attached and electrically interconnected to the circuit traces by conductive balls, 110, preferably mounted by a solder reflow process or conductive epoxy or other interconnect process that provide a mechanically and electrically sound connection.

Figure 13:
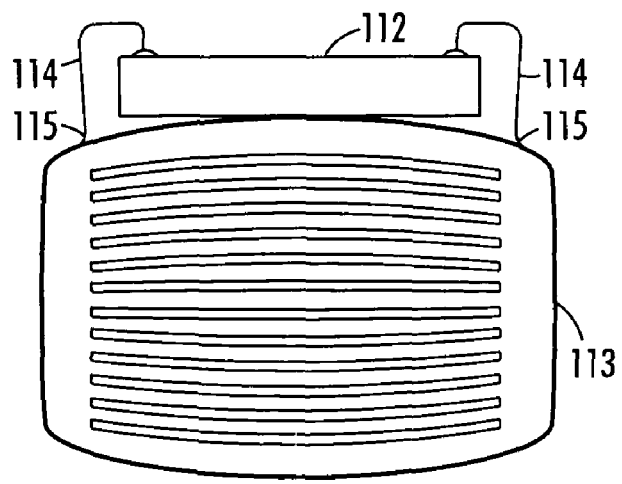
FIG. 13 illustrates wire bonding interconnect with curvature in the MLCC.

FIG. 13 Illustrates the issues associated with trying to use the wire bonding process to interconnect the I/C, 112, to the MLCC, 113. Due to the potential curvature of the MLCC, the I/C does not make intimate surface contact with the surface of the MLCC and the wires, 114, are bonded, 115, at the outer corners of the MLCC and forced to bond to a rounded corner rather than an optimized flat surface.

Figure 14:
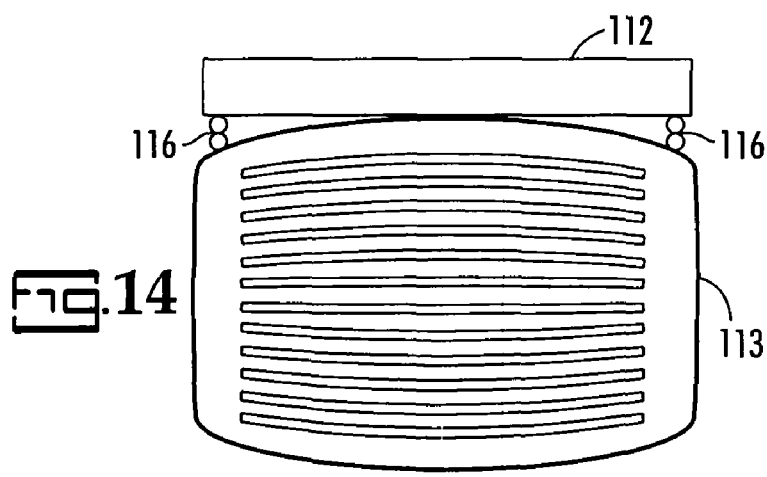
FIG. 14 illustrates an embodiment of the invention.

FIG. 14 illustrates how the Flip Chip technology allows for a smaller MLCC, 113, mounted to an I/C, 112, and the curvature is compensated for by the use of solder spheres, 116, large enough in diameter to compensate for some curvature up to approximately <0.008 inches of deviation per inch.

Figure 15:
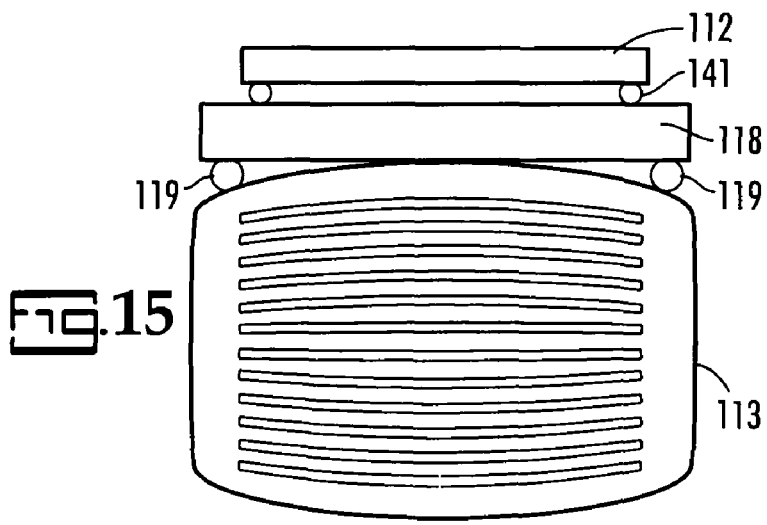
FIG. 15 illustrates another embodiment of the invention.

FIG. 15 illustrates the use of a flex circuit, in this case referred to a Re-Distribution Layer (RDL), 118. RDL's are small flex circuits made up of generally copper conductors sandwiched between two layers of kapton, a high temperature tolerant material. Total thickness can vary depending on application, but typically for this application would be approximately 0.004 inches thick. The Flip Chip I/C, 112, is attached to the RDL, 118, by solder balls, 141. Large solder spheres, 119, are placed on the contact pads of the RDL, then the RDL is placed to the MLCC, 113, and the solder spheres are reflowed, thus making an electrical and mechanical connection to the MLCC. This design allow for curvatures of greater than 0.008 inches/linear inch. This is accomplished by the flex of the RDL and staggering the location of the solder bumps of the I/C with respect to the solder bumps of the RDL to provide for maximum flex between the curved surface of the MLCC and the RDL.

Figure 16:
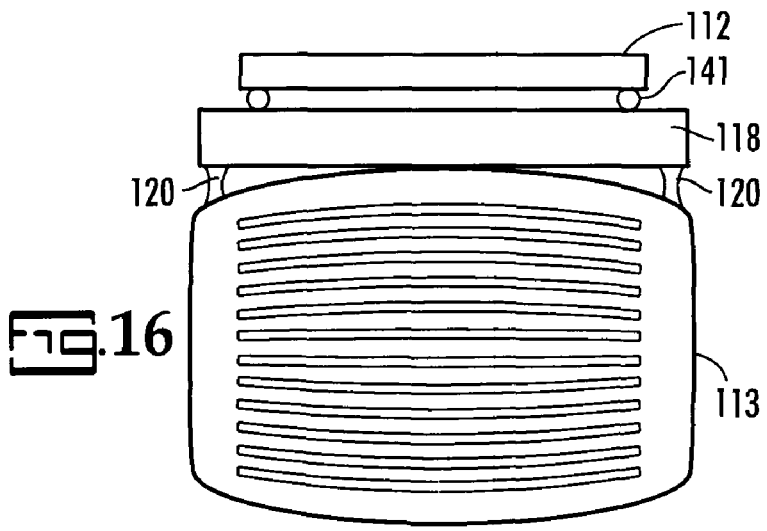
FIG. 16 illustrates another embodiment of the invention.

FIG. 16 illustrates the solder columns, 120, between the RDL and the MLCC after solder reflow.

Figure 17:
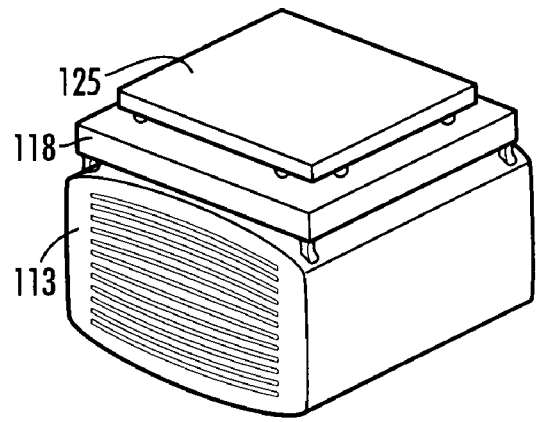
FIG. 17 illustrates yet another embodiment of the invention.

FIG. 17 illustrates the MLCC, 113, with the RDL, 118, and its mounted Flip Chip, 125, as a finished assembly ready to be mounted onto a circuit board.

Figure 18:
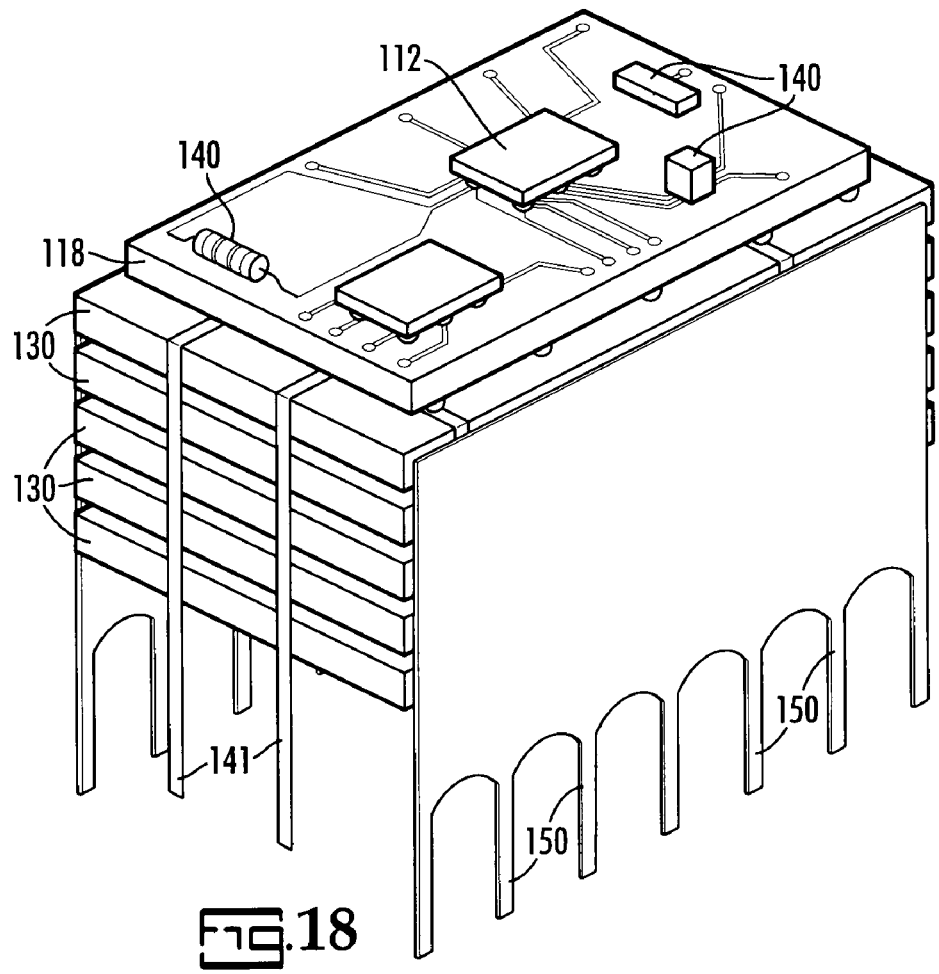
FIG. 18 illustrates yet another embodiment of the invention.

FIG. 18 illustrates how the solution for attaching multiple I/C's similar in size to a small MLCC can be enlarged to larger stacked MLCC's, 130, to take advantage of the larger available surface area on the top of the MLCC and use a larger RDL, 118, that may contain multiple I/C's, 112, and multiple other components, 140, and the necessary circuitry provided by the RDL and using either the connections, 141, on the termination side of the MLCC or separate leads attached to the non conductive ends of the MLCC to provide electrically isolated leads extending down to the circuit board. Pins, 150, are provided for subsequent attachment as would be realized in the art. Other components include active and passive components with passive components being preferred. Particularly preferred components include resistors, varistors, capacitors, thermistors, fuses, inductors, filters, diodes, coils, potentiometers and the like.

The process may be further simplified by attaching the substrates to the circuit board first using pick and place technology or the like, then attaching the electronic chip. Glob top overfills or the like may be used as needed for environmental protection or the like. Underfills may be used to accommodate differential thermal stresses or the like as needed. Process steps illustrated do not include testing, packaging or other ancillary steps. This application incorporates both PCT/US08/53730 filed Feb. 12, 2008 and U.S. patent application Ser. No. 11/705,260 filed Jul. 18, 2008 by reference.

This invention sets forth a solution to solve an interconnect issue that existed when trying to attach an Integrated Circuit (I/C) to an MLCC of similar size but having a surface curvature of 0.008 inches/inch. The flip chip technology offered the greatest flexibility in dealing with the curvature issue and also allowing the MLCC size to approach the size of the I/C thus optimizing functionality for a given component foot print. The Flip Chip was combined with the RDL technology to enhance the assembly processes and providing additional capability to handle curvatures exceeding 0.008 inches per linear inch of length, due to the flexibility of the RDL. Previously, this much curvature or deviation was not useable and would require rework or scrapping.

The "bumps" on the flip chip can be formed in a number of process methods such as but not limited to plate up, stud bumping via thermo-sonic wire bonding technology, placement of solder spheres of selected sizes the type of bump is well within the ability of one of ordinary skill in the art based on the teachings herein.

Solder is the typical interconnect material of choice when attaching flip chips to substrates. The solder is usually deposited in the form of a solder paste to the substrate, the electronic chips are then placed on the substrates with proper alignment and the configuration is reflowed together to establish a good electrical and mechanical attachment. This process is relatively low cost and can be utilized for processing individual substrates or substrates that are processed in a "multi-up" array configuration that are singulated into individual components in subsequent processing steps.

The Z-axis dimension of the 3 dimensional conductive structure, as measured perpendicular to the electronic chip, is selected such that it exceeds the maximum Z-axis dimension of the combined curvature of the substrate and electronic chip by at least 2.5% including any collapse of the three dimensional conductive structure during the attachment process. The wafer is then singulated into individual electronic chips, each with the desired pattern of 3 dimensional conductive structures of the appropriate Z-axis dimension to achieve appropriate stand-off of the substrate and the electronic chip(s).

Particularly suitable bonding techniques include dipping the three dimensional structure into solder paste or dispensing solder paste onto the bond pads of the RDL and then passing the assembly through a reflow process of sufficient temperature to cause the solder material to reflow.

Other electrical and mechanical interconnects to the RDL can be accomplished either by thermo-sonic bonding, curing of a conductive epoxy or other interconnect technologies that are practiced in the surface mount electronics industry. Note that the use of reflow attachment techniques may require the use of a higher temperature solder for the chip to substrate attachment as compared to the solder used for the substrate to circuit board attachment.

The assembly approach can take several different paths depending upon the degree of automation that is desired. Provided herein are preferred steps in the assembly flow starting with the I/C wafer without limit thereto. The solder bumps are preferably deposited on each I/C bond pad while the I/C is in the wafer format. The I/C's are then preferably tested, sorted and shipped to the user ready for assembly. Different methods of packaging the I/C's is suitable including waffle packs, tape and reel and flex frames without limit thereto.

When Re-Distribution Layer (RDL)-Flex Circuit are used they can be purchased from a number of flex circuit suppliers and received as individual circuits, in strips, or in array formats. Individual circuits are preferred The end user typically does additional assembly. Bumped I/C's and RDL's are typically provided to the end user from outside suppliers. MLCC's are then manufactured at the end user's manufacturing site though this is not required. An RDL would be oriented and placed in a locating fixture and solder paste would be applied to each individual pad that correlates with the solder bumps on the I/C. The I/C would be picked from the shipping container and aligned. A pick and place unit would secure the I/C from the back, flip it over to a face with a bumps down position and then place the I/C solder bumps into the solder paste that was applied to the RDL. After placing the I/C into the solder paste, the assembled device can then be placed in a reflow oven to reflow the solder and create an electrical and mechanically secure joint. After the Flip Chip to RDL reflow is complete the next step is attachment to the MLCC. An MLCC would be oriented and placed into a locating fixture. Solder paste would be applied to the MLCC at each desired solder joint location. The reflowed RDL would then be oriented and placed into the MLCC assembly fixture and in contact with the dispensed solder paste. The assembly would then be sent through a reflow oven to reflow the solder and make electrical and mechanical connections between the RDL and the MLCC. The finished assembly would then be removed from the reflow fixture and ran through a cleaning process. After cleaning the assembly would then be functionally tested and good parts will be loaded into the appropriate shipping containers.

Solder bumps have particular advantages in the present invention. The placement and alignment of flip chips is not critical. They can accommodate up-to 10 degrees of misalignment depending on the pad and bump geometry. The final alignment can be achieved by the physical nature of the solders surface tension and its natural tendencies to form perfect spheres when molten. A misaligned flip chip can actually be pulled into position. Bumps can also be formed on the RDL to take advantage of the natural alignment tendencies of the solder. By taking advantage of the physical properties of molten solder expensive vision and high precision placement equipment is not required, for assembly, thus reducing capital costs. The RDL, as well as the flip chip, design can be assembled in various stages from manual assembly to highly automated assembly, depending on the thru-put and cost justifications.

Circuit boards, also referred to as substrates, typically comprise FR4, G10, and even flex circuits and other organic composite boards meeting desired electrical and mechanical properties.

The present invention has been described with reference to the preferred embodiments without limit thereto. One of skill in the art would realize additional embodiments which are based on the teachings herein, without specific reference thereto, which are within the metes and bounds of the claims appended hereto.

The invention claimed is:

1. A method of forming an electrical component comprising:
   preparing a subassembly by electrically connecting an integrated circuit to a flexible circuit;
   forming a capacitor having a mounting surface with a curvature deviation exceeding 0.008 inches per linear inch; and
   attaching said subassembly to said mounting surface of said multilayer ceramic capacitor.

2. The method of forming an electrical component of claim 1 wherein said flexible circuit further comprises at least one component.

3. The method of forming an electrical component of claim 2 wherein said component is a passive component selected from the group consisting of current limiter, varistor, sensor, fuse, thermistor, resistor and inductor.

4. The method of forming an electrical component of claim 2 wherein said component is applied prior to said electrically connecting an integrated circuit to a flexible circuit.

5. The method of forming an electrical component of claim 2 wherein said component is applied prior to said attaching.

6. The method of forming an electrical component of claim 1 wherein said electrically connecting comprises a method selected from solder reflow, wire bonding, thermosonic bonding, bump bonding, plate-up, pin attach, ball attach, adhesive attach and conductive epoxy curing.

7. The method of forming an electrical component of claim 6 wherein said electrically connecting comprises solder reflow.

8. The method of forming an electrical component of claim 1 further comprising interconnecting active circuits of said flexible circuit to a main control circuit of a circuit board via electrically isolated terminals at an end of said multilayer ceramic capacitor.

9. The method of forming an electrical component of claim 1 wherein said multilayer ceramic capacitor comprises a stack of primary multilayer ceramic capacitors.

10. A method for forming an electronic component comprising:
    providing a flexible circuit;
    providing an integrated circuit;
    providing a multilayer ceramic capacitor wherein said multilayer ceramic capacitor comprises a curvature of at least 0.08 inches per linear inch;
    placing said flexible circuit in a locating fixture;
    applying solder paste to at least one pad of said flexible substrate;
    picking said integrated circuit from a shipping container;
    aligning said integrated circuit with said solder paste;
    reflowing said solder paste to form an electrical connection between each said pad and said integrated circuit;
    placing said multilayer ceramic capacitor in a second locating fixture;
    applying second solder paste to said multilayer ceramic capacitor;
    orienting said flexible substrate, with said integrated circuit mounted thereon, with said multilayer ceramic capacitor; and
    reflowing said second solder paste to form an electrical connection between said flexible substrate and said multilayer ceramic capacitor.

11. The method for forming an electronic component of claim 10 wherein said flexible substrate further comprises at least one secondary component.

12. The method for forming an electronic component of claim 10 wherein said second solder paste has a height Z above said multilayer ceramic capacitor wherein said height Z is higher than said curvature.

13. The method for forming an electronic component of claim 12 wherein said height Z is higher than 125% of said curvature.

14. The method for forming an electronic component of claim 12 wherein said height Z is at least as high as said curvature deviation, a stand-off distance between the substrate and said electronic component and a compression distance.

* * * * *